United States Patent
Taji et al.

[11] Patent Number: 6,075,267
[45] Date of Patent: Jun. 13, 2000

[54] SPLIT-GATE NON-VOLATILE SEMICONDUCTOR MEMORY DEVICE

[75] Inventors: Satoru Taji, Sanda; Hiroaki Nakanishi, Kobe, both of Japan

[73] Assignee: Ricoh Company, Ltd., Tokyo, Japan

[21] Appl. No.: 08/806,447

[22] Filed: Feb. 26, 1997

[30] Foreign Application Priority Data

Feb. 28, 1996 [JP] Japan .................................. 8-069096

[51] Int. Cl.⁷ ................................................ H01L 29/788
[52] U.S. Cl. ..................... 257/316; 257/315; 257/319; 257/321; 365/185.15; 438/257
[58] Field of Search .................................. 257/315, 316, 257/314, 319, 321; 438/257, 266; 365/185.14, 185.15, 185.26, 185.29

[56] References Cited

U.S. PATENT DOCUMENTS

| | | | |
|---|---|---|---|
| 4,151,021 | 4/1979 | McElroy | 438/257 |
| 4,868,629 | 9/1989 | Eitan | 257/316 |
| 5,029,130 | 7/1991 | Yeh | 365/185.31 |
| 5,278,439 | 1/1994 | Ma et al. | 257/319 |
| 5,280,446 | 1/1994 | Ma et al. | 365/185.15 |
| 5,486,711 | 1/1996 | Ishida | 257/258 |
| 5,592,002 | 1/1997 | Kanamori | 257/321 |
| 5,625,212 | 4/1997 | Fukumoto | 257/321 |

FOREIGN PATENT DOCUMENTS

| | | |
|---|---|---|
| 2023672 | 1/1990 | Japan . |
| 2240968 | 9/1990 | Japan . |

*Primary Examiner*—Valencia Martin-Wallace
*Assistant Examiner*—George C. Eckert, II
*Attorney, Agent, or Firm*—Cooper & Dunham LLP

[57] ABSTRACT

A non-volatile semiconductor memory device includes a substrate and a continuously formed drain diffusion layer and a continuously formed source diffusion layer which are alternately arranged within the substrate. Floating gates are disposed via a tunnel insulating film on the substrate so that they are adjacent to the drain diffusion layer. The floating gates are opposed to each other with the drain diffusion layer therebetween, and spaced away from the source diffusion layer. A control gate extends in a direction orthogonal with a direction in which the source and drain diffusion layers extend, the control gate being formed on the floating gates and the substrate via an insulating film. A select channel is provided between the floating gate closest to the source diffusion layer and the source diffusion layer. A thick insulating film is provided between the drain diffusion layer and the control gate between the floating gates which are opposed to each other with the drain diffusion layer therebetween.

2 Claims, 5 Drawing Sheets

SPLIT-GATE NON-VOLATILE SEMICONDUCTOR MEMORY DEVICE

BACKGROUND OF THE INVENTION

1. Field of the Invention

The present invention relates to non-volatile semiconductor memory devices having a floating gate such as an EPROM, an EEPROM, and a flash memory. More particularly, the present invention relates to a non-volatile semiconductor memory device categorized as a split gate type device and a manufacturing method thereof.

2. Description of the Related Art

In an EEPROM or a flash memory, electrical erasing is performed. However, if an over erase condition occurs, a channel under a floating gate is placed in a depletion state. When the device is placed in a depletion state, it will conduct leakage current at the time of reading, resulting in a read failure. For this reason, in an ETOX type memory cell such as a standard EPROM, control is carried out to perform verification for each chip or for each bit in order to prevent the over erase condition from occurring. However, this poses problems since the control is difficult, a verifying circuit must be provided, and erasing time is increased.

To solve such problems, a split gate type non-volatile semiconductor memory device has been proposed. As shown in FIG. 1, in the split gate type device, a floating gate 10 is formed near a drain diffusion layer 4 via a tunnel insulating film 8 on a channel area between the drain diffusion layer 4 and a source diffusion layer 6 formed on a substrate 2. The channel area formed between drain diffusion layer 4 and source diffusion layer 6 consists of a memory channel (MC) under the floating gate 10 and a select channel (SC) under an offset area which extends from an end of the floating gate 10 to the source diffusion layer 6. Formed on the floating gate 10 via an insulating film 12 is a control gate (or select gate) 14. Control gate 14 extends over the floating gate 10 to the offset area of the channel. As depicted in FIG. 1, the region of floating gate 10 not covered by control gate 14, provides a misalignment allowance region when control gate 14 is formed.

In the split gate type device described above with respect to FIG. 1, if the memory channel (MC) is placed in a depletion state, leakage current is prevented by the adjoining select channel (SC).

Such a split gate memory device is described in, for example, U.S. Pat. No. 5,029,130 and U.S. Pat. No. 5,280,446. However, in these memory devices, the select channel is not formed in a self alignment fashion, which can cause misalignment between the floating gate 10 and the control gate 14 with a resultant change in the length of the select channel SC. Accordingly, the select channel SC must be made slightly longer to compensate for this misalignment. However, this prevents a smaller memory cell from being achieved. In addition, variations in the length of the select channel (SC) can cause variations in cell current during a read operation. This leads to deteriorated memory device characteristics.

Various methods have been used to manufacture a split gate type memory device using self alignment. One such method is described in Japanese Laid-Open document 2-23672. A control gate is formed on the floating gate and on a source side wall of the floating gate. The control gate is formed in a self-alignment manner. However, since the length of the select channel is decided by the width of the side wall spacer, the length of the select channel cannot be freely set. In addition, the width of the floating gate must be made larger than the width of the control gate which is formed thereon (which is decided by patterning), thus preventing the device from being made smaller.

In another method described in Japanese Laid-Open document 2-240968, a dummy gate composed of polysilicon is provided on the same layer as the floating gate. Self alignment is achieved so that the length of the select channel is equal to the distance between the dummy gate and the floating gate.

However, even if the length of the select channel could be decided by self alignment, a standard memory cell requires that a drain contact be provided for each bit or for every two bits. This limits reduction in size of the cell.

SUMMARY OF THE INVENTION

An embodiment of the present invention relates to a non-volatile semiconductor memory device including a substrate. A continuously formed drain diffusion layer and a continuously formed source diffusion layer are alternately arranged within the substrate to form a plurality of parallel strips. Floating gates are formed via a tunnel insulating film on the substrate so that they are adjacent to the drain diffusion layer, the floating gates being opposed to each other with the drain diffusion layer therebetween and spaced away from the source diffusion layer. A control gate extends in a direction orthogonal with a direction in which the source and drain diffusion layers extend, the control gate being formed on the floating gates and the substrate via an insulating film. A select channel is provided between the floating gate closest to the source diffusion layer and the source diffusion layer and a thick insulating film is provided between the drain diffusion layer and the control gate between the floating gates which are opposed to each other with the drain diffusion layer therebetween.

According to another embodiment, a non-volatile semiconductor memory device includes a substrate. A continuously formed drain diffusion layer and a continuously formed source diffusion layer are alternately arranged within the substrate to form a plurality of parallel strips. Floating gates are disposed via a tunnel insulating film on the substrate so that they are adjacent to the drain diffusion layer, the floating gates being opposed to each other with the drain diffusion layer therebetween, and spaced away from the source diffusion layer. Control gates extend in a direction in which the source and drain diffusion layers extend, the control gates being provided on the floating gates via an insulating film, the floating gate and control gate forming a stacked gate. A select gate extends in a direction orthogonal with a direction in which the source and drain diffusion layers extend, the select gate being formed on the control gates and the substrate via an insulating film, a select channel being provided between the floating gate closest to the source diffusion layer and the source diffusion layer. A thick insulating film is provided between the drain diffusion layer and the select gate between the stacked gates which are opposed to each other with the drain diffusion layer therebetween.

A method of manufacturing a non-volatile semiconductor memory device is also disclosed and includes the steps of forming a first electrode material film on a semiconductor substrate via a tunnel insulating film and producing a pattern on the first electrode material film and etching so that the first electrode material film remains on areas where continuously formed sources are to be formed and areas where a plurality of floating gates are to be formed. A resist pattern having openings is formed in areas where continuously formed drains are to be formed and which are parallel to the areas where the sources are to be formed. An impurity is implanted into the substrate using the resist pattern as a mask, thereby forming a drain diffusion layer. An insulating film fills in a gap between adjoining electrode material films which are arranged in parallel to a direction in which areas where the continuously formed sources are to be formed extend. The electrode material film formed on the areas where the continuously formed sources are to be formed is selectively removed. An impurity is implanted in the substrate in the areas where the continuously formed sources are to be formed, thereby producing a source diffusion layer. Insulating film remaining between the sources diffusion layers and the floating gates closest to the source diffusion layers is removed while leaving the insulating film within gaps between the electrode material films formed above and on either side of the drain diffusion layer. A gate insulating film is formed on the floating gates and the source diffusion layer. A second electrode material film is formed on the gate insulating film and the second electrode material film is patterned to cover the first electrode material film and form a control gate which extends in the direction orthogonal with the direction in which the source and drain diffusion layers extend.

Another method of manufacturing a non-volatile semiconductor memory device according to an embodiment of the present invention comprises steps of forming stacked gates on a semiconductor substrate in areas where a source is to be formed and areas where a gate is to be formed, the stacked gates consisting of a floating gate having a control gate formed thereon via an insulating film. The stacked gates are arranged in parallel to a direction in which an area where the source is to be formed extends. A resist pattern is formed having an opening in an area where a drain is to be formed and which is parallel to the area where the source is to be formed. An impurity is implanted into the substrate by using the resist pattern as a mask, thereby forming a drain diffusion layer. A gap between adjoining stacked gates which are arranged in parallel to a direction in which the area where the source is to be formed extends is filled with an insulating film. The stacked gates formed on the areas where the source is to be formed are selectively removed and an impurity is implanted in the substrate in the area where the source is to be formed, thereby producing a source diffusion layer. Insulating film remaining between the source diffusion layer and the floating gates closest to the source diffusion layer is removed while leaving the insulating film within gaps between the stacked gates above and on either side of the drain diffusion layer. A gate insulating film is formed on the stacked gates and the source diffusion layer. An electrode material film is formed on the insulating film and the electrode material film is patterned to cover the stacked gate to form a select gate which extends in the direction orthogonal with a direction in which the source and drain diffusion layers extend.

Preferably, the insulating film filling the gap between the first electrode material films or the stack gates has a lower layer composed of a silicon nitride film and an upper layer composed of a silicon oxide film. In this case, to remove the insulating film filling the source diffusion layer, the silicon oxide film is removed first. At this time, the silicon nitride film serves as an etching stopper which prevents a tunnel oxide film under the floating gate from being undercut.

Since the gap between the first electrode material films or stack gates is filled with an insulating film, the thickness of the insulating film is preferably at least half of the largest interval between the first electrode material films or the stack gates.

DETAILED DESCRIPTION OF THE INVENTION

Figure 1:
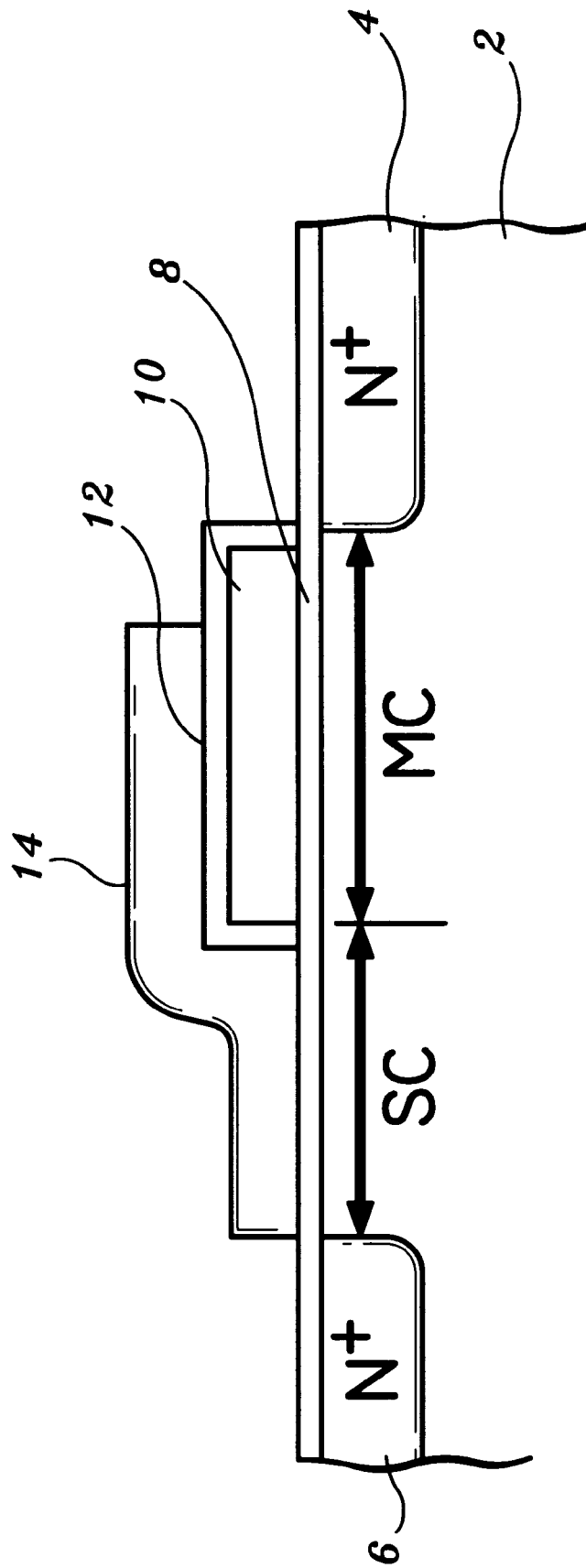
FIG. 1 is a schematic sectional view illustrating a conventional split gate type memory device.
Figure 2A:
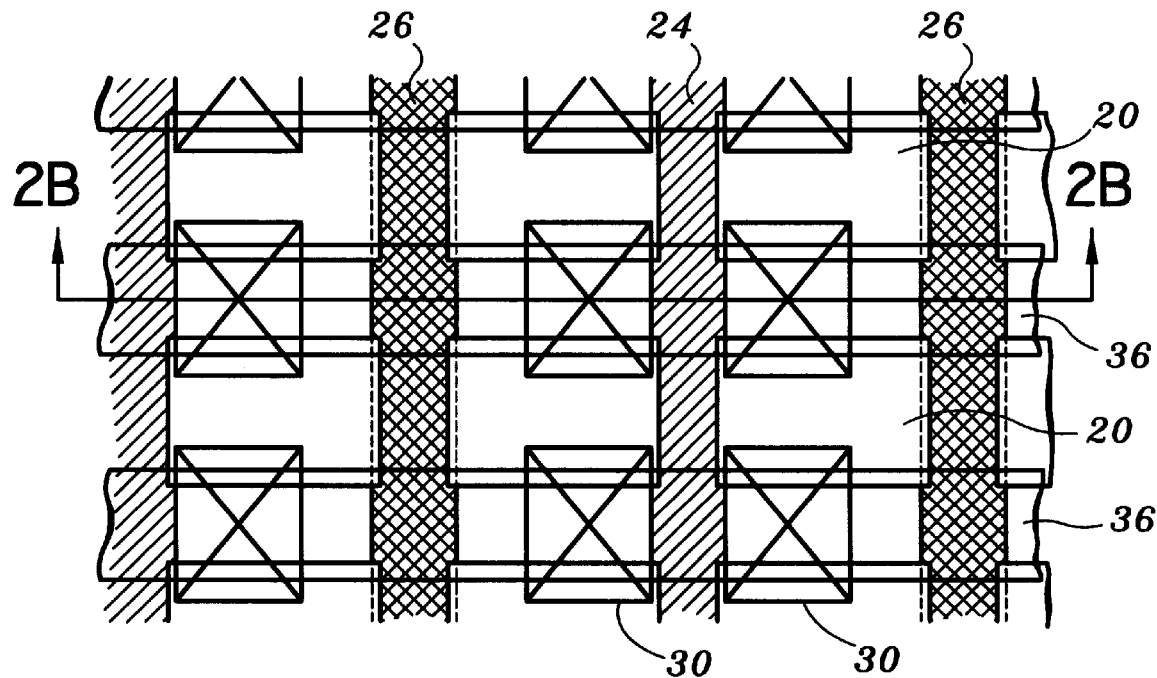
FIG. 2A is a schematic top plan view showing a first embodiment of the present invention.
Figure 2B:
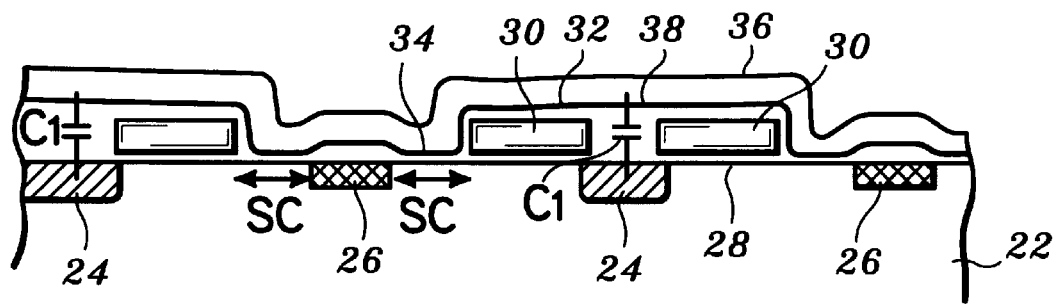
FIG. 2B is a sectional view taken along line 2B–2B' shown in FIG. 2A

FIGS. 2A and 2B show a first embodiment of the present invention.

Drain diffusion layers 24 and source diffusion layers 26 are alternately arranged on a p-type silicon substrate 22 to provide a plurality of parallel strips. Floating gates 30 are formed on substrate 22 via a tunnel oxide film 28 so that they are opposed to each other above drain diffusion layer 24 with drain diffusion layer 24 therebetween. Floating gates 30 are spaced away from the source diffusion layer 26 on a plurality of straight lines which are orthogonal to a direction in which the source and drain diffusion layers 24 and 26 extend. A control gate 36 is formed above floating gates 30 extending in the direction orthogonal to the direction in which the drain and source diffusion layers 24 and 26 extend. Control gate 36 is formed on floating gates 30 via an insulating film 32 and on the substrate 22 between the floating gate 30 and the source diffusion layer 26 via a gate oxide film 34. A select channel (SC) is thus provided between the floating gate 30 and the source diffusion layer 26 as shown in FIG. 2B. A thick insulating film 38 exists between the drain diffusion layer 24 and the control gate 36 as a filler between the floating gates 30. Reference numeral 20 (FIG. 2A) denotes an element separating field oxide film.

In this embodiment, the drain diffusion layers 24 and the source diffusion layers 26 are formed continuously for a plurality of memory cells. Hence, it is no longer necessary to provide drain contacts for each bit or for every two bits. For example, contacts may be provided for every 16 to 64 bits, thus permitting significant reduction in cell size.

Because thick insulating film 38 fills in the gap between floating gates 30, between the drain diffusion layer 24 and control gate 36, parasitic capacitance $C_1$ between the drain diffusion layer 24 and the control gate 36 can be reduced. This minimizes any drop in operating speed of the semiconductor device.

A method of manufacturing the split gate type device shown in FIG. 2 will now be described by reference to FIGS. 3A–3G.

Figure 3A:
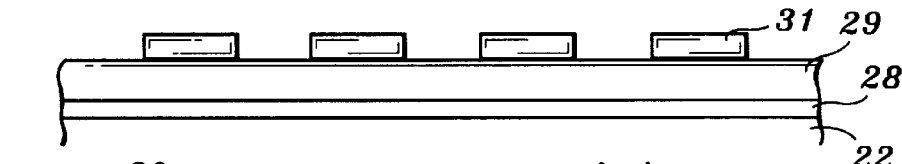
FIGS. 3A–3G are sectional views illustrative of the steps of the manufacturing method according to an embodiment of the present invention.

A field oxide film is formed according to a standard MOS process. As shown in FIG. 3A, a tunnel oxide film 28 of 60 to 100 Å is formed over the entire surface of substrate 22. An n-type doped polysilicon film 29 having a thickness ranging from 1000 to 1500 Å is then grown thereon. A resist layer 31 is formed on the polysilicon film 29 and patterning is carried out in such a manner that the resist is left in the areas where the floating gates are expected to be formed and the areas where the source diffusion layers are expected to be formed. Using the resist pattern as the mask, the polysilicon film 29 and tunnel oxide film 28 are etched as shown in FIG. 3B to produce polysilicon patterns 30 as the floating gates and polysilicon patterns 30a on the areas where the source diffusion layers are expected to be formed.

Figure 3B:
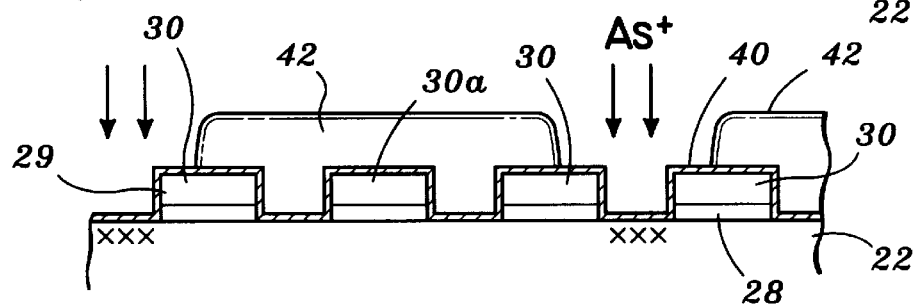

As shown in FIG. 3B, a silicon nitride film 40 of 100 to 1000 Å is then formed on the entire surface. A resist pattern 42, which has openings only in the areas where the drain diffusion layers are expected to be formed, is then formed. Using resist pattern 42 as the mask, an arsenic or phosphorus n-type impurity is ion-implanted into the semiconductor substrate 22, the dose being $10^{14}$ to $10^{16}/Cm^2$.

Figure 3C:
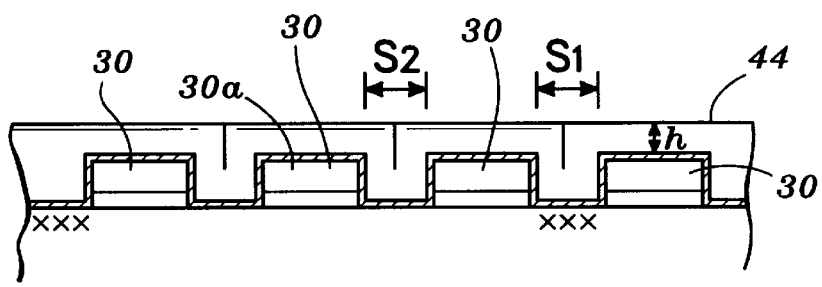

As shown in FIG. 3C, if the interval S1 between polysilicon patterns 30 is equal to the interval S2 between pattern 30 and pattern 30a, then this interval is taken as S. If they are not equal, then the greater of the two intervals is taken as S. The spaces between polysilicon patterns 30 and the spaces between the polysilicon patterns 30 and 30a are filled by depositing a CVD-SiO$_2$ film 44 to a height (h) above patterns 30 which is slightly thicker than S/2.

By depositing the CVD-SiO$_2$ film 44 to a thickness which is larger than half of the distance S1 between the polysilicon patterns 30 or the distance S$_2$ between the polysilicon patterns 30 and 30a on the select channel area, whichever is greater, the gap between polysilicon patterns can be filed relatively flatly.

Figure 3D:
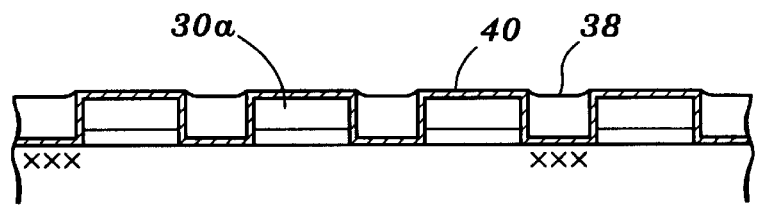

As shown in FIG. 3D, film 44 on the entire surface is then etched back until the silicon nitride film 40 is exposed. This fills the spaces between the polysilicon patterns 30 and 30a with the silicon oxide film 38 (a thick insulating film).

Figure 3E:
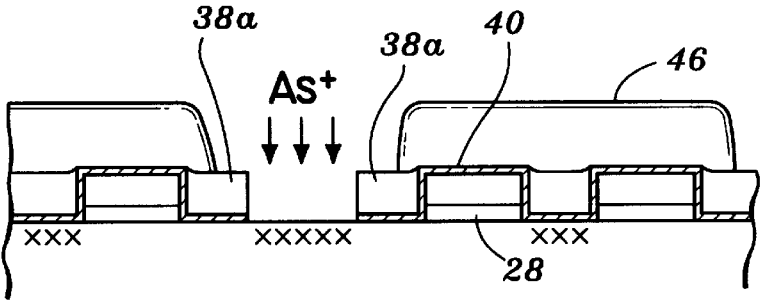

As shown in FIG. 3E, resist pattern 46 having openings only in the areas where the source diffusion layers are expected to be formed is deposited. The silicon nitride film 40 and the polysilicon pattern 30a in the openings are selectively removed by etching. After that, an arsenic or phosphorus n-type impurity which provides the source diffusion layer is ion-implanted, the dose ranging from $10^{14}$ to $16^{16}/cm^2$.

Figure 3F:
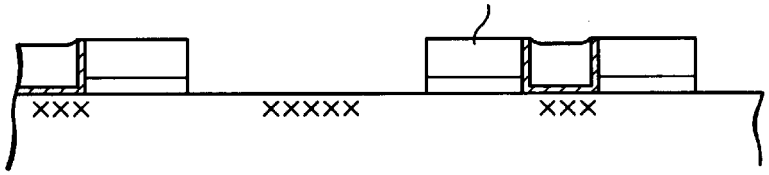

With resist 46 still in place, the silicon oxide film 38a near the source diffusion layer is removed by etching with an HF solution. The silicon nitride film 40 prevents the tunnel oxide film 28 under the polysilicon patterns 30 of the floating gate from being etched. As shown in FIG. 3F, resist 46 is then removed. Silicon nitride film 40 is then removed with hot nitric acid.

Figure 3G:
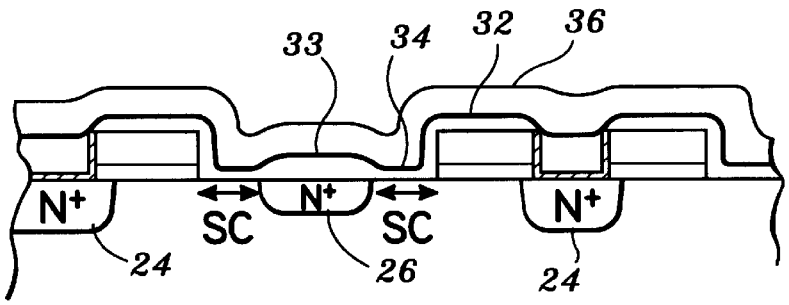

As shown in FIG. 3G, a gate oxide film 34 forming the select gate is grown on the entire surface to a thickness of 100 to 200 Å. In this case, oxidation in the area of the source diffusion layer 26 and around the polysilicon is accelerated and oxide films 32 and 33 having a thickness ranging from 300 to 1000 Å are formed.

Then, polysilicon doped with phosphorus or arsenic is formed on the entire surface prior to patterning so as to produce control gates 36 which extend in strips in the direction orthogonal with the direction in which the source and drain diffusion layers extend.

As shown by the manufacturing process illustrated in FIGS. 3A–3G, the select channel SC is formed in a self alignment manner, enabling reduction in size and with minimal variations in the semiconductor's characteristics.

Figure 4A:
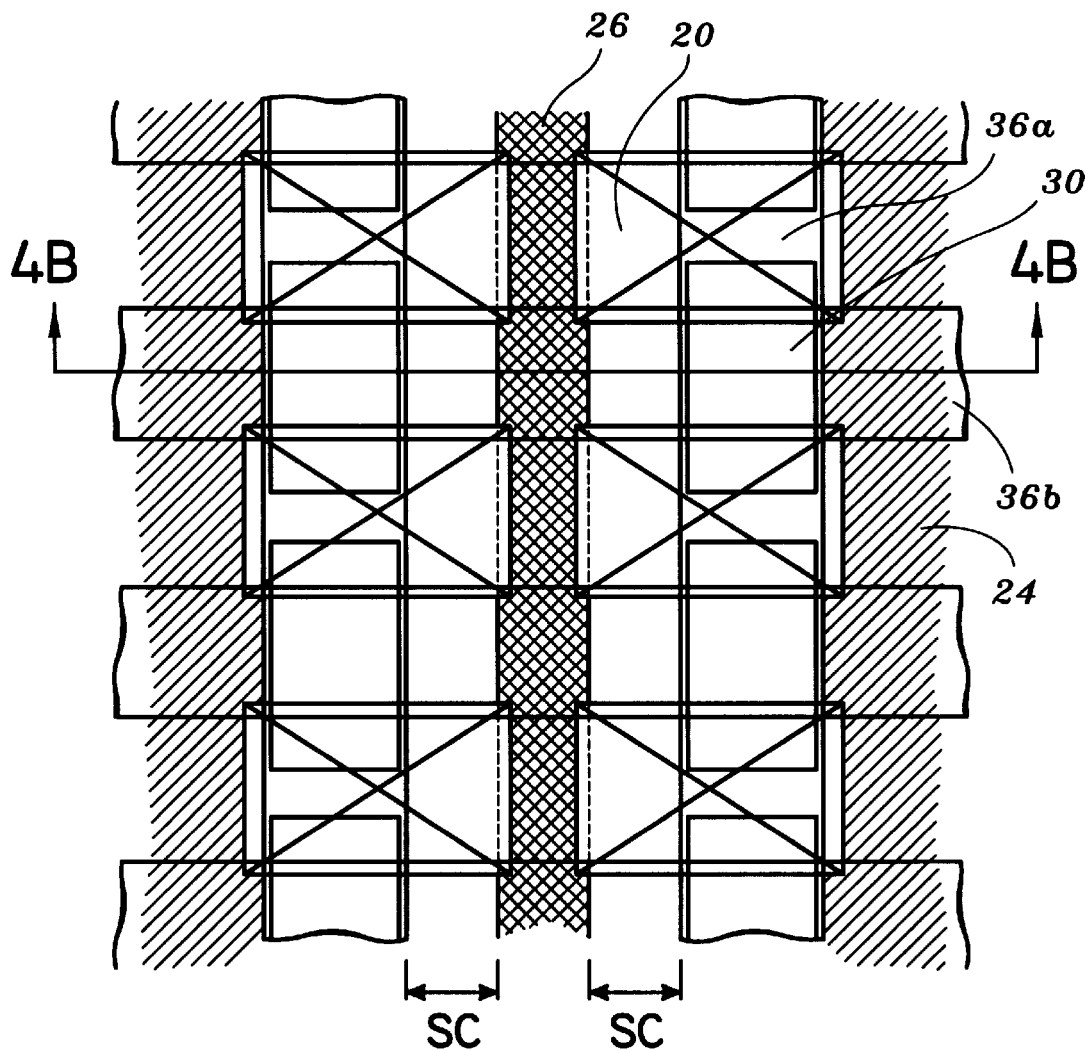
FIG. 4A is a schematic top plan view showing a second embodiment of the present invention.
Figure 4B:
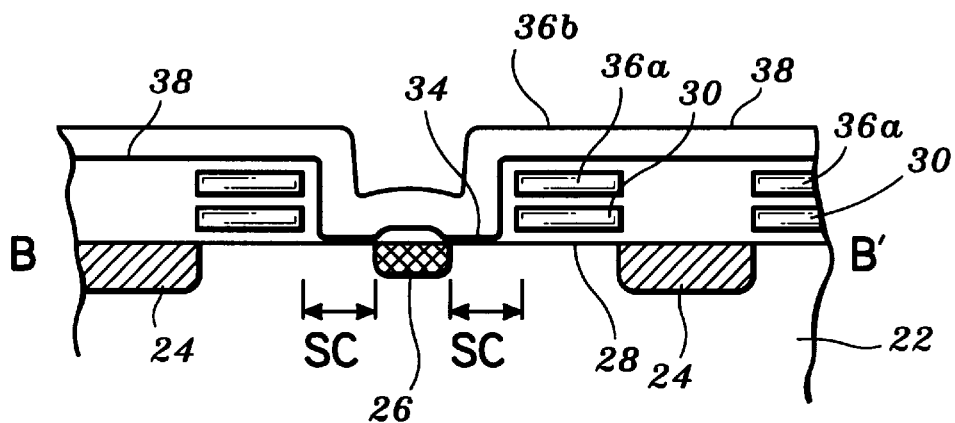
FIG. 4B is a sectional view taken along line 4B–4B' shown in FIG. 4A.

FIGS. 4A and 4B show a second embodiment wherein the present invention is applied to a three-layer polysilicon split gate type memory cell. This embodiment is similar to the embodiment shown in FIGS. 2A and 2B, except that floating gates 30 are replaced by an SAMOS electrode (a stack gate composed of floating gate 30 and a control gate 36a).

More specifically, drain diffusion layers 24 and source diffusion layers 26 are arranged alternately on the p-type silicon substrate 22 to provide a plurality of parallel strips. The floating gates 30 are disposed via tunnel oxide film 28 on the substrate 22 so that they are opposed to each other above the drain diffusion layer 24, with the drain diffusion layer 24 therebetween. Floating gates 30 are spaced away from the source diffusion layer 26 on a plurality of straight lines which are orthogonal with a direction in which the drain and source diffusion layers 24 and 26 extend. Control gates 36a, which extend in the direction in which the drain and source diffusion layers 24 and 26 extend, are formed on the floating gates 30 with an insulating film therebetween. A select gate 36b which extends in a direction orthogonal with the direction in which the drain and source diffusion layers 24 and 26 extend is formed on control gate 36a via an insulating film and on the substrate 22 between the floating gate 30 and the source diffusion layer 26 via gate oxide film 34. A select channel (SC) is provided between the floating gate 30 and the source diffusion layer 26 under the select gate 36b. The thick insulating film 38 exists between the drain diffusion layer 24 and the select gate 36b as a filler between the stacked gates which are opposed to each other with the drain diffusion layer 24 therebetween.

Figure 5A:
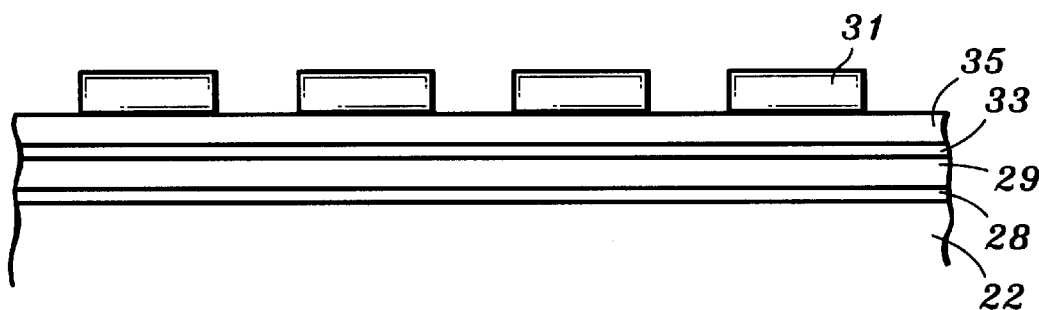
FIGS. 5A and 5B are sectional views illustrative of several steps of the manufacturing method according to an embodiment of the present invention.
Figure 5B:
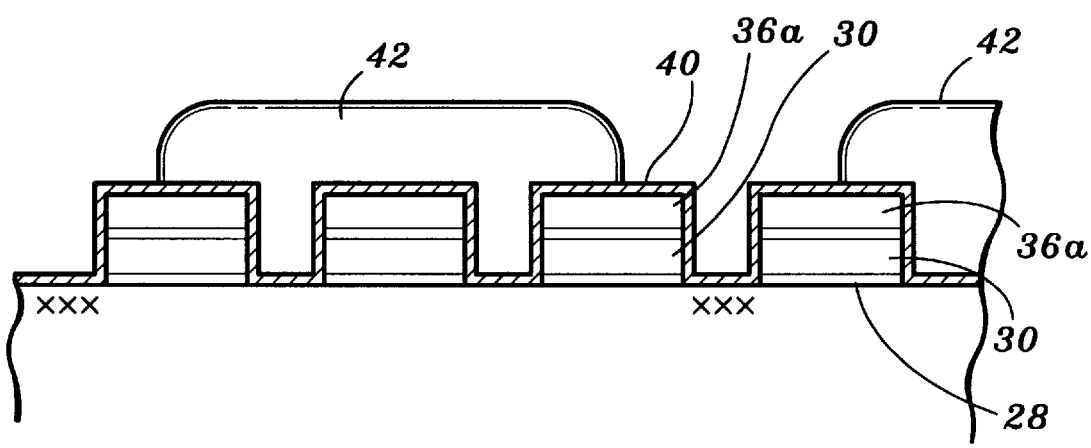

The manufacturing method for this embodiment of the present invention is similar to that for the embodiment shown in FIGS. 3A–3G. However, according to this embodiment, the SAMOS electrode (the stacked gate composed of floating gate 30 and control gate 36a) is formed prior to the first polysilicon film being patterned. That is, as shown in FIG. 5A, a tunnel oxide film 28 of 60 to 100 Å is formed over the entire surface of substrate 22. An n-type doped polysilicon film 29 having a thickness ranging from 1000 to 1500 Å is then grown thereon. A tunnel oxide film 33 of 60 to 100 Å is then formed over the entire surface of film 29. An n-type doped polysilicon film 35 having a thickness ranging from 1000 to 1500 Å is then grown thereon. A resist layer 31 is formed on polysilicon film 35 and patterning is carried out in such a manner that the resist is left in the areas where the floating gates are expected to be formed and the areas where the source diffusion layers are expected to be formed. Using the resist pattern as the mask, the polysilicon films 29 and 35 and the tunnel oxide films 28 and 33 are etched as shown in FIG. 5B to produce the stacked gates consisting of floating gates 30 and control gates 36a. A silicon nitride film 40 of 100 to 1000 Å is then formed on the entire surface. A resist pattern 42, which has openings only in the area where the drain diffusion layers are expected to be formed, is then formed. Using resist pattern 42 as the mask, an arsenic or phosphorous n-type impurity is ion-implanted into the semiconductor substrate 22, the dose being $10^{14}$ to $10^{16}/cm^2$. The remaining steps are similar to the steps described above with respect to FIGS. 3C–3G and will therefore not be described in further detail.

According to the present invention, since the drain diffusion layers and the source diffusion layers are formed continuously, only one contact may be provided, for example, for every 16 to 64 bits, thus permitting a significant reduction in cell size.

Since the thick insulating film fills in the gap between the drain diffusion layer and the control gate parasitic capacitance $C_1$ between the drain diffusion layer and the control gate can be reduced. This restrains the drop in the operating speed of the device.

The manufacturing method in accordance with the present invention enables the select channel SC to be formed in a self alignment manner, thereby permitting a reduction in size and restrained variations in the semiconductor's characteristics.

The insulating film filling the gap between the polysilicon patterns or the stack gates has a lower layer composed of a silicon nitride film and an upper layer composed of a silicon oxide film so that the silicon nitride film serves as an etching stopper which prevents the tunnel oxide film under the floating gate from being undercut. This enables selective removal of the silicon oxide film when etching the silicon oxide film to remove the insulating film.

While the invention has been described with reference to specific embodiments, the description is illustrative of the invention and is not to be construed as limiting the invention. Various modifications and applications may occur to those skilled in the art without departing from the true spirit and scope of the invention as defined in the appended claims.

What is claimed is:

1. A nonvolatile semiconductor memory device comprising:

a substrate;

a continuously formed drain diffusion layer and a continuously formed source diffusion layer which are alternately arranged within the substrate to form a plurality of parallel strips;

floating gates disposed via a tunnel insulating film on said substrate so that they are adjacent to the drain diffusion layer, the floating gates being opposed to each other with the drain diffusion layer therebetween, and spaced away from the source diffusion layer;

a control gate which extends in a direction orthogonal with a direction in which the source and drain diffusion layers extend, the control gate being formed on the floating gates and the substrate via an insulating film, a select channel being provided between the floating gate closest to the source diffusion layer and the source diffusion layer; and a thick insulating film provided between the drain diffusion layer and the control gate between the floating gates which are opposed to each other with the drain diffusion layer therebetween.

2. A non-volatile semiconductor memory device comprising;

a substrate;

a continuously formed drain diffusion layer and a continuously formed source diffusion layer which are alternately arranged within the substrate to form a plurality of parallel strips;

floating gates disposed via a tunnel insulating film on said substrate so that they are adjacent to the drain diffusion layer, the floating gates being opposed to each other with the drain diffusion layer therebetween, and spaced away from the source diffusion layer;

control gates which extend in a direction in which the source and drain diffusion layers extend, the control gates being provided only in an area above the floating gates via an insulating film, the floating gate and control gate forming a stacked gate;

a select gate which extends in a direction orthogonal with a direction in which the source and drain diffusion layers extend, the select gate being formed on the control gates and the substrate via an insulating film, a select channel being provided between the floating gate closest to the source diffusion layer and the source diffusion layer; and a thick insulating film provided between the drain diffusion layer and the select gate between the stacked gates which are opposed to each other with the drain diffusion layer therebetween.

* * * * *